(12) United States Patent
Seo et al.

(10) Patent No.: US 11,456,347 B2
(45) Date of Patent: Sep. 27, 2022

(54) DISPLAY DEVICE INCLUDING PRINTED CIRCUIT BOARD ATTACHED TO END OF DISPLAY PANEL

(71) Applicant: Samsung Display Co., LTD., Yongin-si (KR)

(72) Inventors: Hae Kwan Seo, Hwaseong-si (KR); Soon Dong Kim, Osan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 296 days.

(21) Appl. No.: 16/812,751

(22) Filed: Mar. 9, 2020

(65) Prior Publication Data
US 2021/0028264 A1    Jan. 28, 2021

(30) Foreign Application Priority Data

Jul. 22, 2019    (KR) .................. 10-2019-0088363

(51) Int. Cl.
| | | |
|---|---|---|
| *H01L 27/32* | (2006.01) | |
| *H01L 21/48* | (2006.01) | |
| *H01L 23/538* | (2006.01) | |
| *H01L 23/00* | (2006.01) | |
| *G09G 3/3275* | (2016.01) | |

(52) U.S. Cl.
CPC ....... *H01L 27/3276* (2013.01); *G09G 3/3275* (2013.01); *H01L 21/486* (2013.01); *H01L 23/5383* (2013.01); *H01L 23/5384* (2013.01); *H01L 24/17* (2013.01); *G09G 2310/08* (2013.01)

(58) Field of Classification Search
CPC ............... H01L 27/3276; H01L 21/486; H01L 23/5383; H01L 23/5384; H01L 23/49838; H01L 23/4985; H01L 2224/16227; H01L 27/32; H01L 51/52; G09G 3/3275; G09G 2310/08; G09G 2300/0426; G09G 3/3208; G09G 3/3233; G09G 3/3291; G02F 1/1345; H05K 1/147; H05K 2201/05

See application file for complete search history.

(56) References Cited

U.S. PATENT DOCUMENTS

| | | | | |
|---|---|---|---|---|
| 2011/0310543 | A1* | 12/2011 | Kim | G02F 1/133308 |
| | | | | 361/679.01 |
| 2012/0069059 | A1* | 3/2012 | Lee | G09G 3/3225 |
| | | | | 345/76 |
| 2013/0257696 | A1 | 10/2013 | Ha et al. | |
| 2016/0351106 | A1* | 12/2016 | Li | G09G 3/36 |
| 2018/0049324 | A1* | 2/2018 | Koo | H01L 23/5383 |
| 2020/0053874 | A1* | 2/2020 | Eom | G06F 1/1652 |

FOREIGN PATENT DOCUMENTS

| | | |
|---|---|---|
| KR | 10-2018-0018167 | 2/2018 |
| KR | 10-1904465 | 12/2018 |

* cited by examiner

*Primary Examiner* — John P. Dulka
(74) *Attorney, Agent, or Firm* — H.C. Park & Associates, PLC

(57) ABSTRACT

A display device including a display panel and a printed circuit board attached to one end portion of the display panel. The printed circuit board includes a base board, a first driving chip module disposed on the base board, and a second driving chip module spaced apart from the first driving chip module. The first driving chip module includes a timing controller and a data driver, and the second driving chip module includes a plurality of modularized driving chips.

19 Claims, 17 Drawing Sheets

DISPLAY DEVICE INCLUDING PRINTED CIRCUIT BOARD ATTACHED TO END OF DISPLAY PANEL

CROSS REFERENCE TO RELATED APPLICATION

This application claims priority from and the benefit of Korean Patent Application No. 10-2019-0088363, filed on Jul. 22, 2019, which is hereby incorporated by reference for all purposes as if fully set forth herein.

BACKGROUND

Field

Embodiments of the present invention relate to a display device.

Discussion of the Background

A display device is a device configured to visually display data. The display device includes a board partitioned into a display area and a non-display area. In the display area, a plurality of pixels are disposed on the board, and in the non-display area, a plurality of pads and the like are disposed on the board. A flexible film (COF Film), on which a driving integrated circuit or the like is mounted, is coupled to the plurality of pads to transmit driving signals to the pixel. Further, a printed circuit board, on which a plurality of driving chips configured to control the driving integrated circuit and the like, are disposed can be attached to the flexible film.

When the printed circuit board is attached to the flexible film, the printed circuit board can be attached to the flexible film using a connector, or can be attached to the flexible film through an anisotropic conductive film (ACF) with the anisotropic conductive film interposed between the flexible film and the printed circuit board.

The above information disclosed in this Background section is only for understanding of the background of the inventive concepts, and, therefore, it may contain information that does not constitute prior art.

SUMMARY

Embodiments of the present invention provide a display device having a simplified module structure in order to reduce the number of components used, and a simplified process to secure a process time.

Embodiments of the present invention also provide a display device capable of ultra-high resolution processing at ultra-high speed.

Additional features of the inventive concepts will be set forth in the description which follows, and in part will be apparent from the description, or may be learned by practice of the inventive concepts.

An embodiment of the present invention provides a display device including: a display panel and a printed circuit board attached to one end portion of the display panel. The printed circuit board includes a base board, a first driving chip module disposed on the base board, and a second driving chip module disposed to be spaced apart from the first driving chip module. The first driving chip module includes a timing controller and a data driver, and the second driving chip module includes a plurality of modularized driving chips.

The plurality of driving chips may include an image data input unit and a power supply unit.

The plurality of driving chips may further include a driving controller.

The image data input unit may be configured to transmit a data signal to the timing controller, and the power supply unit may be configured to transmit a power signal to the display panel.

The timing controller may be configured to transmit the data signal and a data control signal to the data driver.

The printed circuit board may further include a conductive layer disposed between the base board and the first driving chip module and bumps disposed between the conductive layer and the first driving chip module, and the first driving chip module may be electrically connected to the conductive layer through the bumps.

The second driving chip module may be electrically connected to the conductive layer.

The display device may further include an insulation layer disposed on the conductive layer and exposed in an area in which the first driving chip module and the second driving chip module are disposed.

The insulation layer may contact with a side surface of each of the first driving chip module and the second driving chip module.

The display device may further include a connector disposed on the base board, and the connector may be electrically connected to a main circuit board.

The connector may overlap the second driving chip module in a thickness direction.

The second driving chip module may further include a first insulation layer disposed between the driving chips and the connector, and a first via configured to pass through the first insulation layer and electrically connect the driving chips and the connector.

The second driving chip module may further include a second insulation layer disposed between the driving chips and the conductive layer, and a second via configured to electrically connect the driving chips and the conductive layer.

The second driving chip module may further include a third via which passes through the first insulation layer and is different from the first via, and a fourth via which passes through the second insulation layer and is different from the second via, and the connector may be electrically connected to the conductive layer through the third via and the fourth via.

The display device may further include a third insulation layer disposed between the first insulation layer and the second insulation layer. The third insulation layer may be disposed on the same layer as the plurality of driving chips, and the third via and the fourth via may be electrically connected to each other through a fifth via of the third insulation layer.

The second driving chip module may further include a frame in which the insulation layers, the vias, and the plurality of driving chips are mounted.

The second driving chip module may further include a connection part disposed on the other surface opposite one surface of the frame facing the second insulation layer, the connection part may be electrically connected to the second via and the fourth via, and the connection part may be electrically connected to the conductive layer.

The third insulation layer and the plurality of driving chips may be spaced apart from each other with a separation space therebetween.

The connector may be disposed so as not to overlap the second driving chip module in a thickness direction.

Another embodiment of the present invention provides a display device including: a display panel and a printed circuit board attached to one end portion of the display panel. The printed circuit board includes a base board, a first driving chip module disposed on the base board, and a second driving chip module disposed to be spaced apart from the first driving chip module. The first driving chip module includes a data driver, the second driving chip module includes a plurality of modularized driving chips, and the plurality of driving chips include an image data input unit, a power supply unit, and a timing controller.

It is to be understood that both the foregoing general description and the following detailed description are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
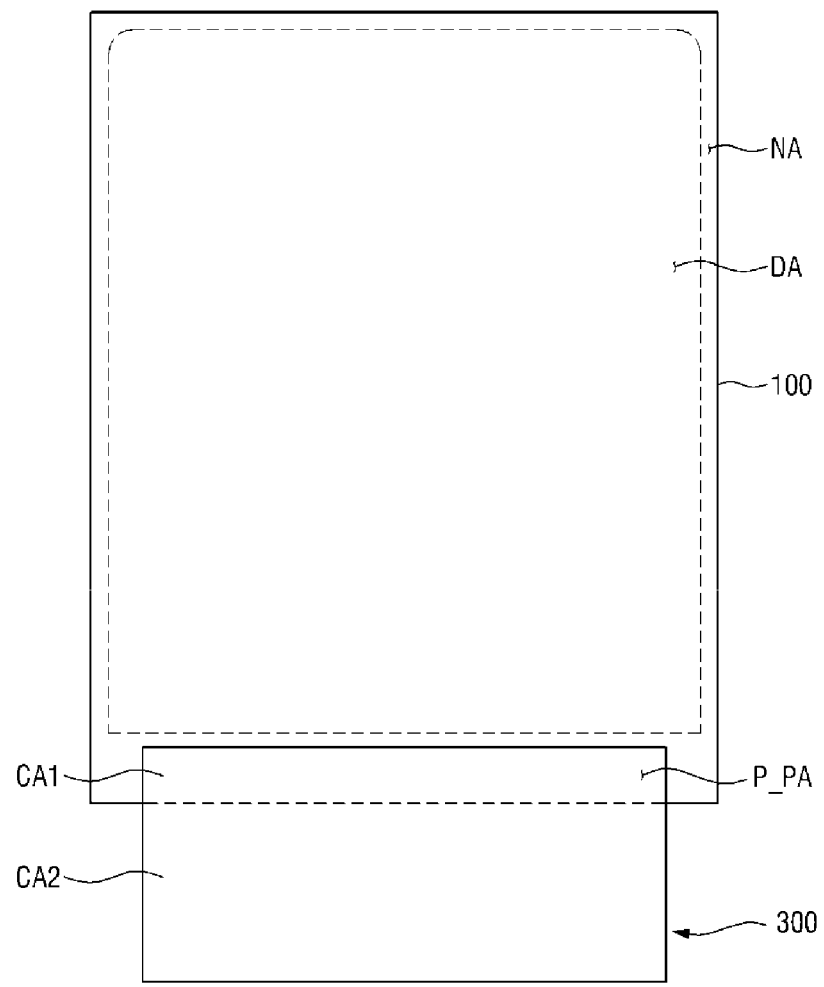
FIG. 1 is a planar layout view of a display device according to an embodiment.
Figure 1:
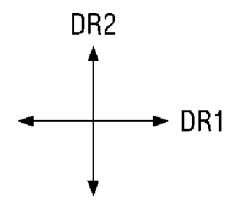

In the following description, for the purposes of explanation, numerous specific details are set forth in order to provide a thorough understanding of various embodiments of the invention. As used herein "embodiments" are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments of the present disclosure will be described with reference to the accompanying drawings.

Figure 2:
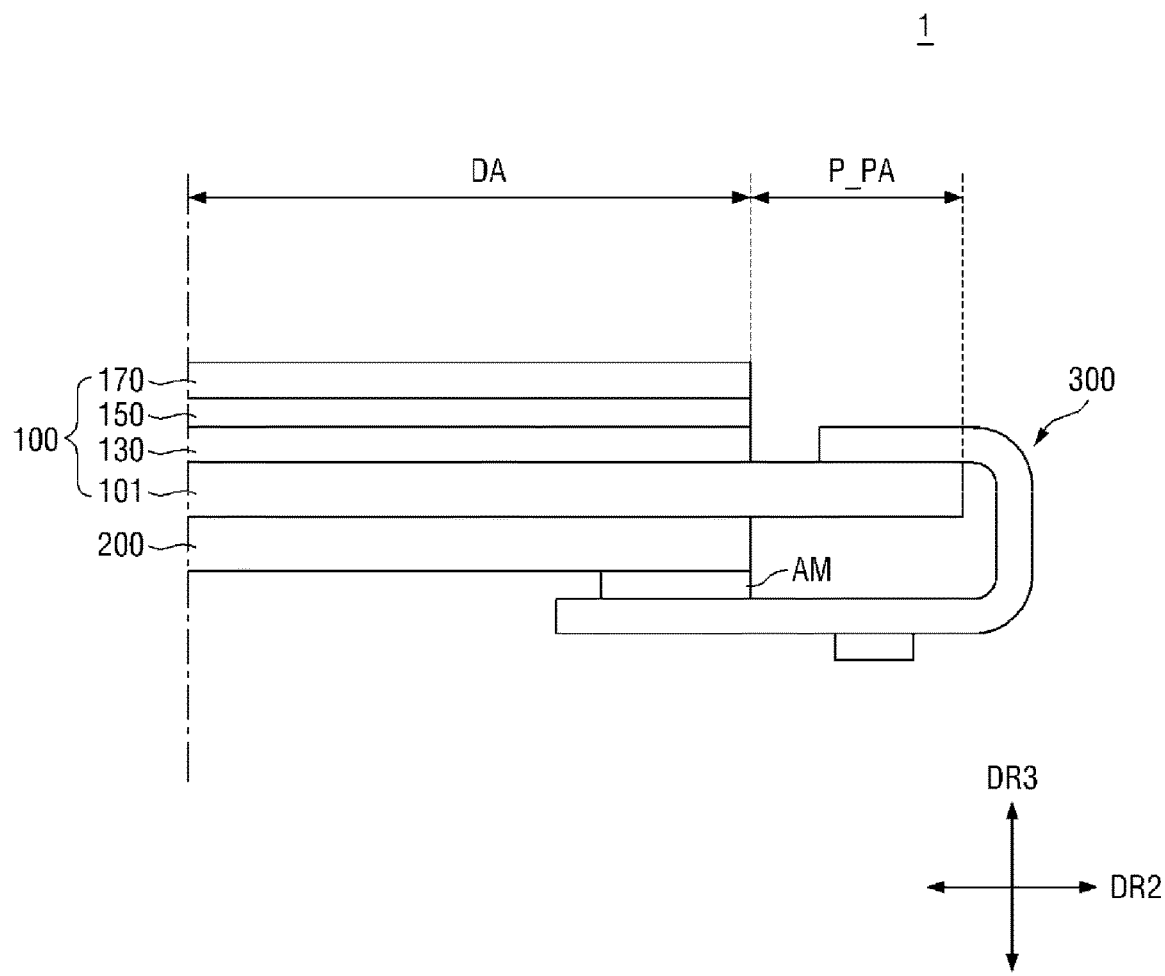
FIG. 2 is a schematic cross-sectional view of the display device in FIG. 1.

FIG. 1 is a planar layout view of a display device according to an embodiment, and FIG. 2 is a cross-sectional view of the display device in FIG. 1.

A display device 1 is a device configured to display a video or a still image, and may be used as a display screen of not only each of portable electronic devices, such as a mobile phone, a smart phone, a tablet PC, a smart watch, a watch phone, a mobile communication terminal, an electronic notebook, an electronic book, a portable multimedia player (PMP), a navigation device, an ultra mobile personal computer (UMPC), and the like, but also each of various products, such as a television, a notebook, a monitor, a billboard, internet of things, or the like.

Referring to FIGS. 1 and 2, the display device 1 may include a display panel 100 configured to display an image, and a circuit board 300 or a flexible printed circuit film connected to the display panel 100.

The display panel 100 may be, for example, an organic light emitting display panel. In the following embodiments, although an example is described in which the organic light emitting display panel is the display panel 100, the inventive concepts are not limited to the above, and various technologies, such as a liquid crystal display (LCD), a quantum dot organic light emitting display (QD-OLED) panel, a quantum dot liquid crystal display (QD-LCD), a quantum nano light emitting display (Nano LED) panel, a micro LED, and the like, may be used for the display panel.

The display panel 100 includes a display area DA including a plurality of pixel areas, and a non-display area NA disposed around the display area DA. The display area DA may have a rectangular shape in which edges are sharp, or a rectangular shape in which edges are rounded in a plan view. The display area DA may have short sides and long sides. The short sides of the display area DA may be sides which extend in a first direction DR1. The long sides of the display area DA may be sides which extend in a second direction DR2. However, a planar shape of the display area DA is not limited to the rectangular shape, and the display area DA may have various shapes, such as a circular shape, an elliptical shape, or the like. The non-display area NA may be disposed adjacent to both short sides and both long sides of the display area DA. In this case, the non-display area NA may surround all sides of the display area DA, and configure an edge of the display area DA. However, the inventive concepts are not limited to the above, and the non-display area NA may be disposed adjacent to only both short sides or only both long sides of the display area DA.

The non-display area NA of the display panel 100 further includes a panel pad area P_PA. The panel pad area P_PA may be, for example, disposed around one short side of the display area DA, but is not limited thereto, and may be disposed around both short sides of the display area DA or around both short sides and both long sides of the display area DA.

The circuit board 300 includes a plurality of stacked structures. The stacked structures may include a base board, a wiring layer or a conductive layer disposed on the base board, and a plurality of driving chip modules disposed on the wiring layer. A detailed description of the stacked structures of the circuit board 300 will be described later.

The circuit board 300 may include a first circuit area CA1 of which one side is attached to the panel pad area P_PA of the display panel 100, and a second circuit area CA2 disposed at one side of the first circuit area CA1 in the second direction DR2.

The driving chip modules of the circuit board 300 may be respectively electrically connected to pads of the display panel 100 through the wiring layer or the conductive layer.

Referring to FIG. 2, the display panel 100 includes a display board 101 disposed throughout the display area DA and the panel pad area P_PA, a circuit layer 130 disposed in the display area DA on the display board 101, a light emitting layer 150 disposed in the display area DA on the circuit layer 130, and an encapsulation layer 170 disposed in the display area DA on the light emitting layer 150. Each of the above-described pixel areas may include the circuit layer 130 and the light emitting layer 150.

The circuit layer 130 may include a display line, a display electrode, and at least one transistor, and control a light emitting amount of the light emitting layer 150. The light emitting layer 150 may include organic light emitting materials. The light emitting layer 150 may be sealed by the encapsulation layer 170. The encapsulation layer 170 may prevent introduction of moisture or the like from the outside by sealing the light emitting layer 150. The encapsulation layer 170 may be formed of a single-layer or multilayer inorganic film, or stacked layers in which inorganic films and organic films are alternately stacked.

The display device 1 further includes a panel lower sheet 200 disposed under the display panel 100. The panel lower sheet 200 may be attached to a back surface of the display panel 100. The panel lower sheet 200 includes at least one functional layer and a lower insulation layer. The functional layer may be a layer configured to perform a heat dissipation function, an electromagnetic shielding function, a grounding function, a buffer function, a strength reinforcement function, a support function, a digitizing function and/or the like. The functional layer may be a sheet layer formed of a sheet, a film layer formed of a film, a thin film layer, a coating layer, a panel, a plate, or the like. One functional layer may be formed of a single layer, but may also be formed of a plurality of stacked thin films or coating layers. The functional layer may be, for example, a support base, a heat dissipation layer, an electromagnetic shielding layer, an impact absorbing layer, a digitizer, or the like.

As shown in FIG. 2, the circuit board 300 may be bent in a downward direction of a third direction DR3. The other side of the circuit board 300 and a second circuit board may be located under the panel lower sheet 200.

The display device 1 may further include an inter-module coupling member AM disposed between the panel lower sheet 200 and the circuit board 300. The inter-module coupling member AM may be a pressure sensitive adhesive (PSA). A lower surface of the panel lower sheet 200 may be coupled to the circuit board 300 through the inter-module coupling member AM. An inner side surface of the inter-module coupling member AM may be recessed further outward than an inner side surface of the circuit board 300. In other words, the inner side surface of the circuit board 300 may protrude further inward than the inner side surface of the inter-module coupling member AM. Accordingly, since the inter-module coupling member AM protrudes to an inner side of the circuit board 300, defects caused by attachment of internal foreign substances or the like may be prevented, and the inter-module coupling member AM may be prevented from flowing down toward a side surface of the circuit board 300 or the like.

A portion of the circuit board 300 further protruding inward than the inter-module coupling member AM may be disposed to be spaced apart from the panel lower sheet 200 thereon with a separation space therebetween.

Figure 3:
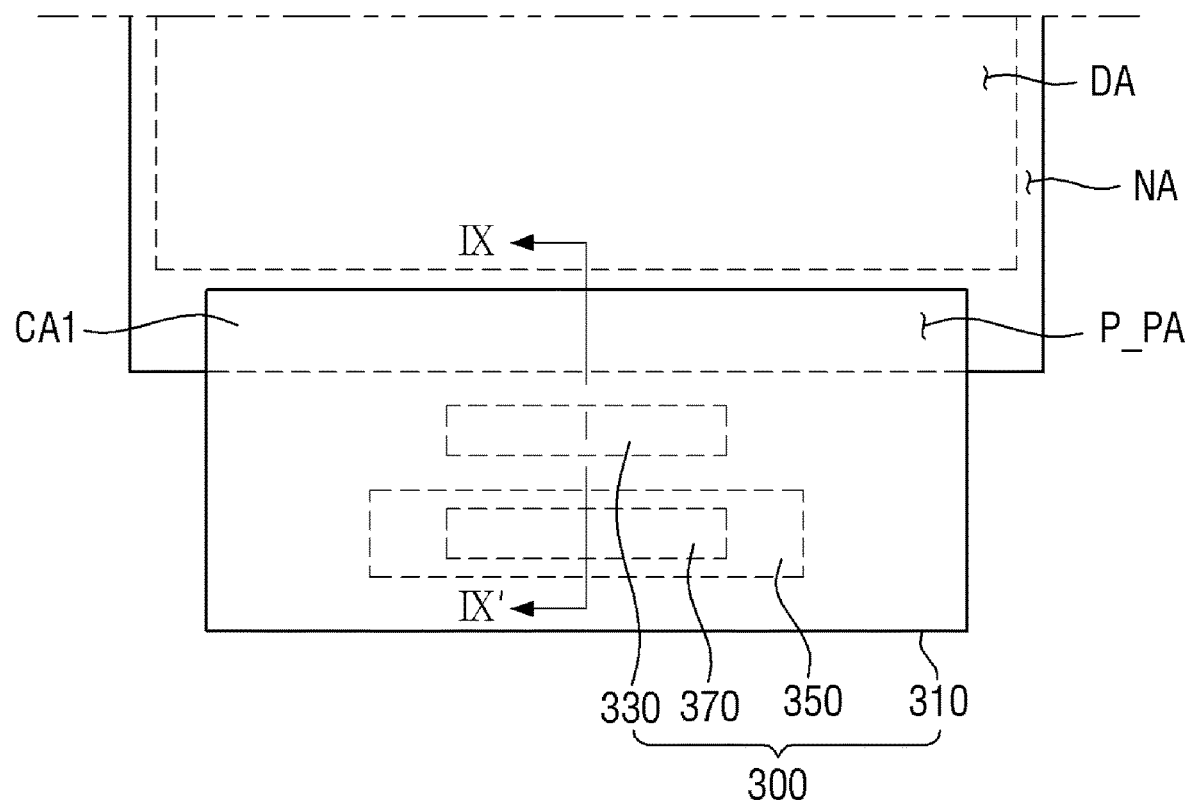
FIG. 3 is a plan view illustrating a display panel, and a printed circuit film having one end portion to which the display panel is attached.

FIG. 3 is a plan view illustrating the display panel, and a printed circuit film having one end portion to which the display panel is attached.

Referring to FIG. 3, the circuit board 300 or the flexible printed circuit film according to an embodiment may include a base board 310, and a first driving chip module 330, a second driving chip module 350, and a connector 370 disposed on the base board 310.

The first driving chip module 330 and the second driving chip module 350 may be spaced apart from each other. For example, as shown in FIG. 3, the second driving chip module 350 may be located lower than the first driving chip module 330 in the second direction DR2. The connector 370 may be disposed to overlap the second driving chip module 350 in a thickness direction.

The first driving chip module 330 may be disposed between the second driving chip module 350 and the panel pad area P_PA or between the second driving chip module 350 and the first circuit area CA1, and the second driving chip module 350 may be disposed between the first driving chip module 330 and an end of the circuit board 300 opposite the end of the circuit board 300 attached to the display panel 100.

Figure 4:
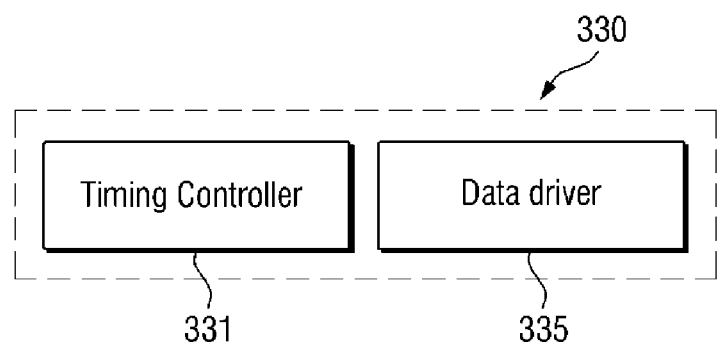
FIG. 4 is a view illustrating a first driving chip module according to an embodiment.
Figure 5:
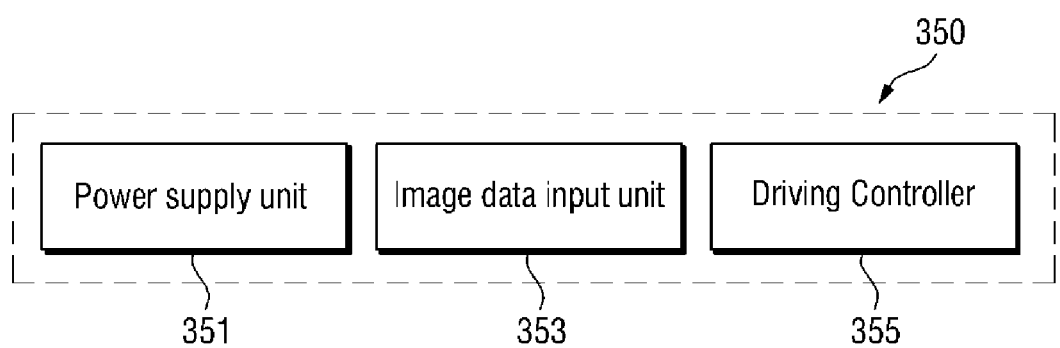
FIG. 5 is a view illustrating a second driving chip module according to an embodiment.
Figure 6:
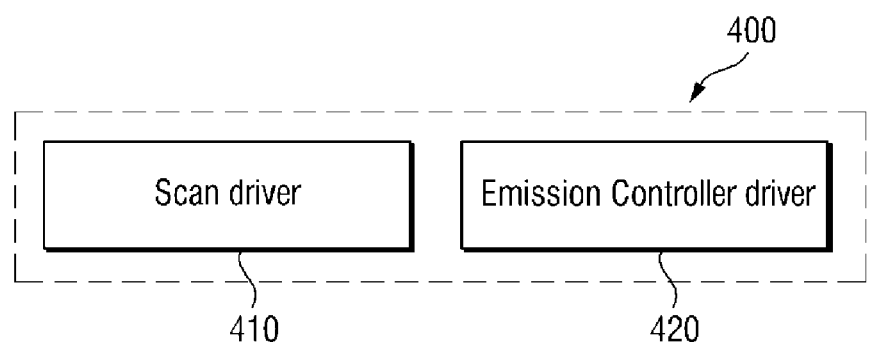
FIG. 6 is a view illustrating a scan driver and an emission control driver disposed on a display panel.
Figure 7:
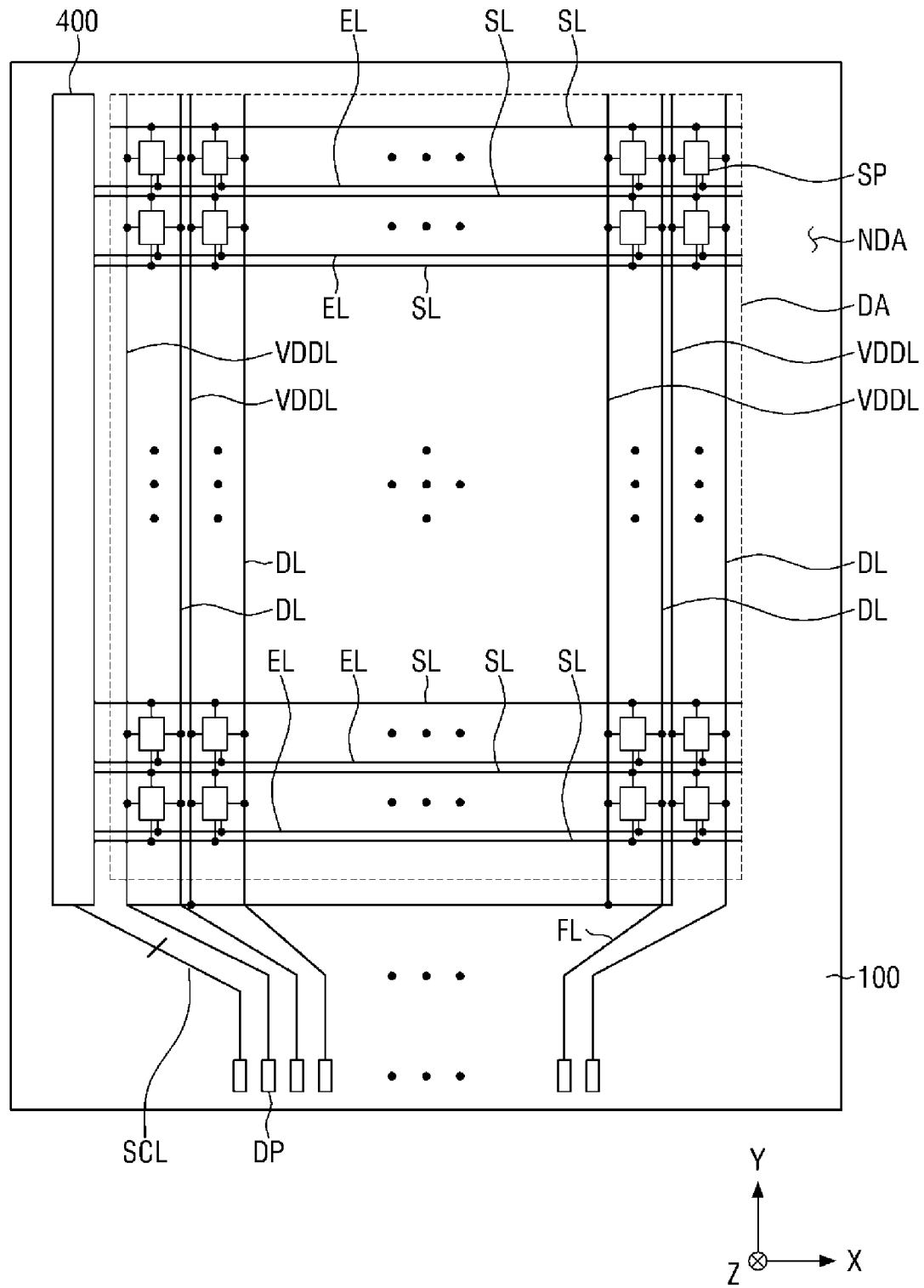
FIG. 7 is a plan view illustrating the display device according to an embodiment.
Figure 8:
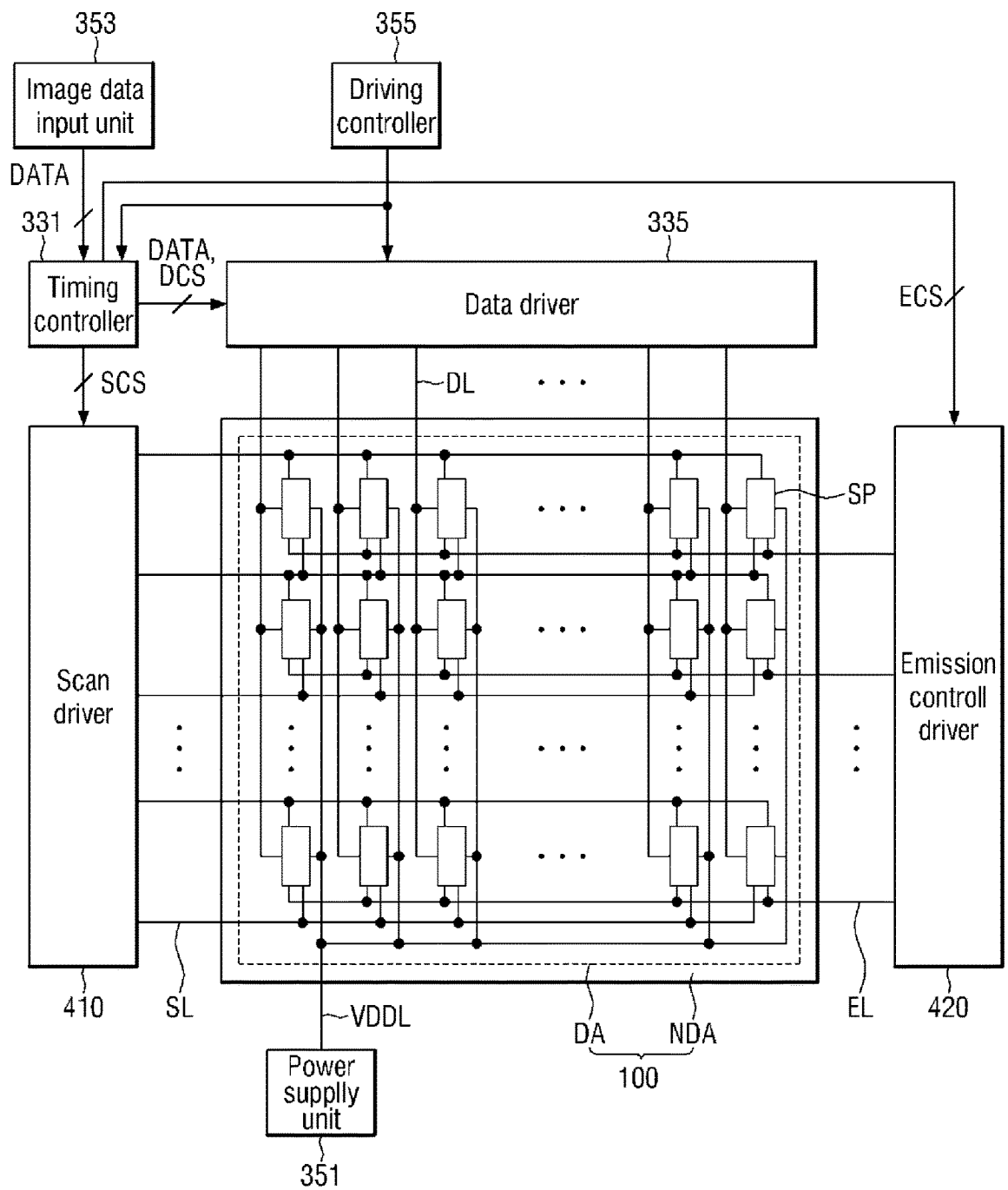
FIG. 8 is a block diagram illustrating the display device according to an embodiment.

FIG. 4 is a view illustrating the first driving chip module according to an embodiment; FIG. 5 is a view illustrating the second driving chip module according to an embodiment; FIG. 6 is a view illustrating a scan driver and an emission control driver disposed on the display panel; FIG. 7 is a plan view illustrating the display device according to an embodiment; and FIG. 8 is a block diagram illustrating the display device according to an embodiment.

Referring to FIGS. 4 to 8, the first driving chip module 330 according to an embodiment may include a timing controller 331 and a data driver 335; the second driving chip module 350 may include a power supply unit 351, an image data input unit 353, and a driving controller 355; and a scan driving circuit 400 may include a scan driver 410 and an emission control driver 420.

The first driving chip module 330 may refer to a module in which the timing controller 331 and the data driver 335 are embedded together, and the second driving chip module 350 may refer to a module in which the power supply unit 351, the image data input unit 353, and the driving controller 355 are embedded together.

In FIG. 5, although an example in which the second driving chip module 350 includes only the power supply unit 351, the image data input unit 353, and the driving controller 355 is described, the inventive concepts are not limited to the above, and other components in addition to a touch driver may also be embedded.

The second driving chip module 350 may be disposed on the circuit board 300 in a panel level package (PLP) manner. The panel level package manner refers to a manner in which the power supply unit 351, the image data input unit 353, and the driving controller 355, and the like disposed on a conventional printed circuit board (PCB) are mounted on a flexible printed circuit board (FPCB) (the circuit board 300 in the specification) together with the first driving chip module 330 including the timing controller 331 and the data driver 335.

Referring to FIGS. 7 and 8, in the display panel 100, sub-pixels SP may be formed in the display area DA to display an image, and the non-display area NDA (NA in FIG. 1) may be disposed around the display area DA. Not only the sub-pixels SP but also scan lines SL, emission lines EL, data lines DL, and first driving voltage lines VDDL connected to the sub-pixels SP may be disposed in the display area DA. The scan lines SL and the emission lines EL may be formed in parallel in the first direction (an X axis direction, DR1 in FIG. 1), and the data lines DL may be formed in parallel in the second direction (a Y axis direction, DR2 in FIG. 1) which crosses the first direction (the X axis direction). The first driving voltage lines VDDL may be formed in parallel in the second direction (the Y axis direction) in the display area DA. The first driving voltage lines VDDL formed in parallel in the second direction (the Y axis direction) in the display area DA may be connected to each other in the non-display area NDA.

Each of the sub-pixels SP may be connected to at least one of the scan lines SL, one of the data lines DL, at least one of the emission lines EL, and the first driving voltage line VDDL. In FIG. 7, although an example in which each sub-pixel SP is connected to two scan lines SL, one data line DL, one emission line EL, and the first driving voltage line VDDL is described, the inventive concepts are not limited to the above. For example, each sub-pixel SP may be connected to three scan lines SL instead of two scan lines SL.

Each of the sub-pixels SP may include a driving transistor, at least one transistor, a light emitting element, and a capacitor. The transistor is turned on when a scan signal is applied from the scan line SL, and accordingly, a data voltage of the data line DL may be applied to a gate electrode of a driving transistor. The driving transistor may emit light by supplying driving currents to the light emitting element according to the data voltage applied to the gate electrode. The driving transistor and at least one switching transistor may be a thin film switching transistor (a thin film transistor). The light emitting element may emit light according to driving currents of the driving transistor. The light emitting element may be an organic light emitting diode including a first electrode, an organic light emitting layer, and a second electrode. The capacitor may serve to uniformly maintain the data voltage applied to the gate electrode of the driving transistor.

The non-display area NDA may be defined as an area from an outer side of the display area DA to an edge of the display panel 100. In the non-display area NDA, the scan driving circuit 400 configured to apply scan signals to the scan lines SL, and fan out lines FL and pads DP between the data lines DL and the circuit board 300 may be disposed. The pads DP may be disposed at one edge of the display panel 100. The pads DP may be disposed in the panel pad area (P_PA in FIG. 1) of the display panel 100.

The scan driving circuit 400 may be electrically connected to the timing controller 331 of the first driving chip module 330 through a plurality of scan control lines SCL. The scan driving circuit 400 may receive scan control signals SCS and emission control signals ECS from the timing controller 331 through the plurality of scan control lines SCL.

As shown in FIG. 8, the scan driving circuit 400 may include the scan driver 410 and the emission control driver 420.

The scan driver 410 may generate scan signals according to the scan control signals SCS, and sequentially output the scan signals to the scan lines SL. The emission control driver 420 may generate emission control signals according to the emission control signals ECS, and sequentially output the emission control signals to the emission lines EL.

The scan driving circuit 400 may include a plurality of thin film transistors. The scan driving circuit 400 may be formed on the same layer as thin film transistors of the sub-pixels SP. In FIG. 7, an example in which the scan driving circuit 400 is formed at one side of the display area DA, for example, at the non-display area NDA at a left side, the inventive concepts are not limited to the above. For example, the scan driving circuit 400 may be formed at both sides of the display area DA, for example, in the non-display areas NDA at the left and right sides of the display area DA.

The timing controller 331 receives digital video data (DATA) and timing signals from the image data input unit 353 and driving controller 355 in the second driving chip module 350. The timing controller 331 generates the scan control signals SCS for controlling an operation timing of the scan driver 410, the emission control signals ECS for controlling an operation timing of the emission control driver 420, and data control signals DCS for controlling an operation timing of the data driver 335, according to the timing signals. The timing controller 331 may output the scan control signals SCS to the scan driver 410, and output the emission control signals ECS to the emission control driver 420 through the plurality of scan control lines SCL. The timing controller 331 may output the digital video data (DATA) and the data control signals DCS to the data driver 335.

The data driver 335 converts the digital video data (DATA) to analog positive/negative data voltages and outputs the analog positive/negative data voltages to the data lines DL through the fan out lines FL. The sub-pixels SP are selected by the scan signals of the scan driving circuit 400, and the data voltages are supplied to the selected sub-pixels SP.

The power supply unit 351 may generate a first driving voltage and supply the first driving voltage to the first driving voltage line VDDL. Further, the power supply unit 351 may generate a second driving voltage and supply the second driving voltage to cathode electrodes of the organic light emitting diodes of the sub-pixels SP. The first driving voltage may be a high potential voltage for driving the high organic light emitting diodes, and the second driving voltage may be a low potential voltage for driving the high organic light emitting diodes. That is, the first driving voltage may have a potential greater than that of the second driving voltage.

The first driving chip module 330 may be formed as an integrated circuit (IC) and disposed on the circuit board 300 in a chip on film (COF) manner.

Figure 9:
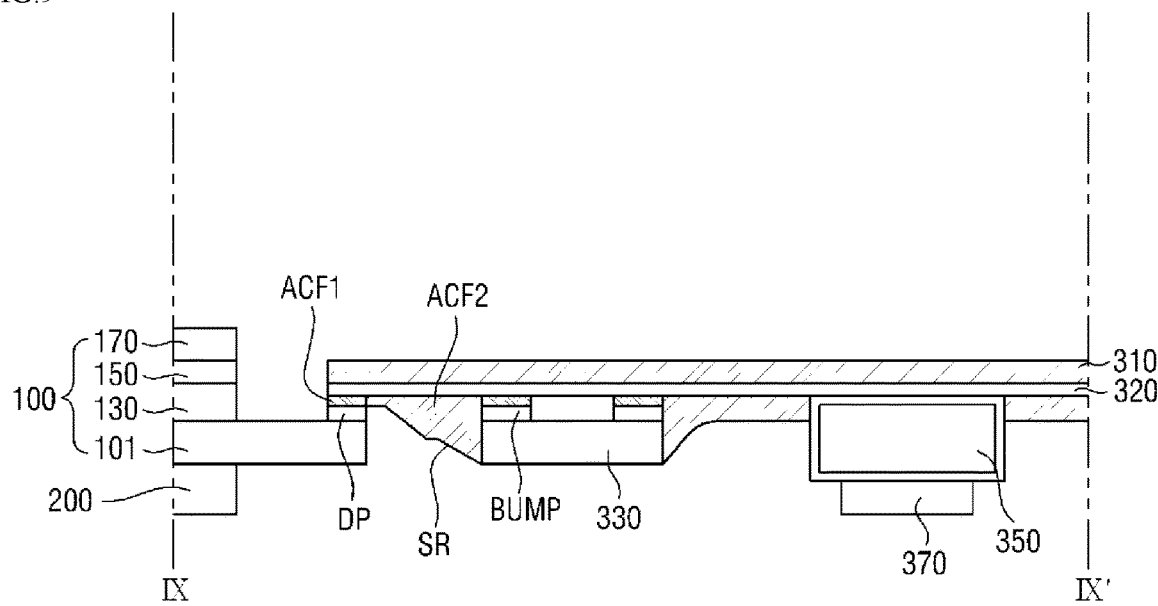
FIG. 9 is a cross-sectional view taken along line IX-IX' in FIG. 3.

The circuit board 300 may be attached to the pads DP using an anisotropic conductive film (see ACF1 in FIG. 9). Accordingly, lead lines of the circuit board 300 may be electrically connected to the pads DP. The circuit board 300 may be a flexible film such as a flexible printed circuit board, a printed circuit board, or a chip on film.

The driving controller 355 of the second driving chip module 350 may serve to control the timing controller 331 and the data driver 335 of the first driving chip module 330.

Figure 10:
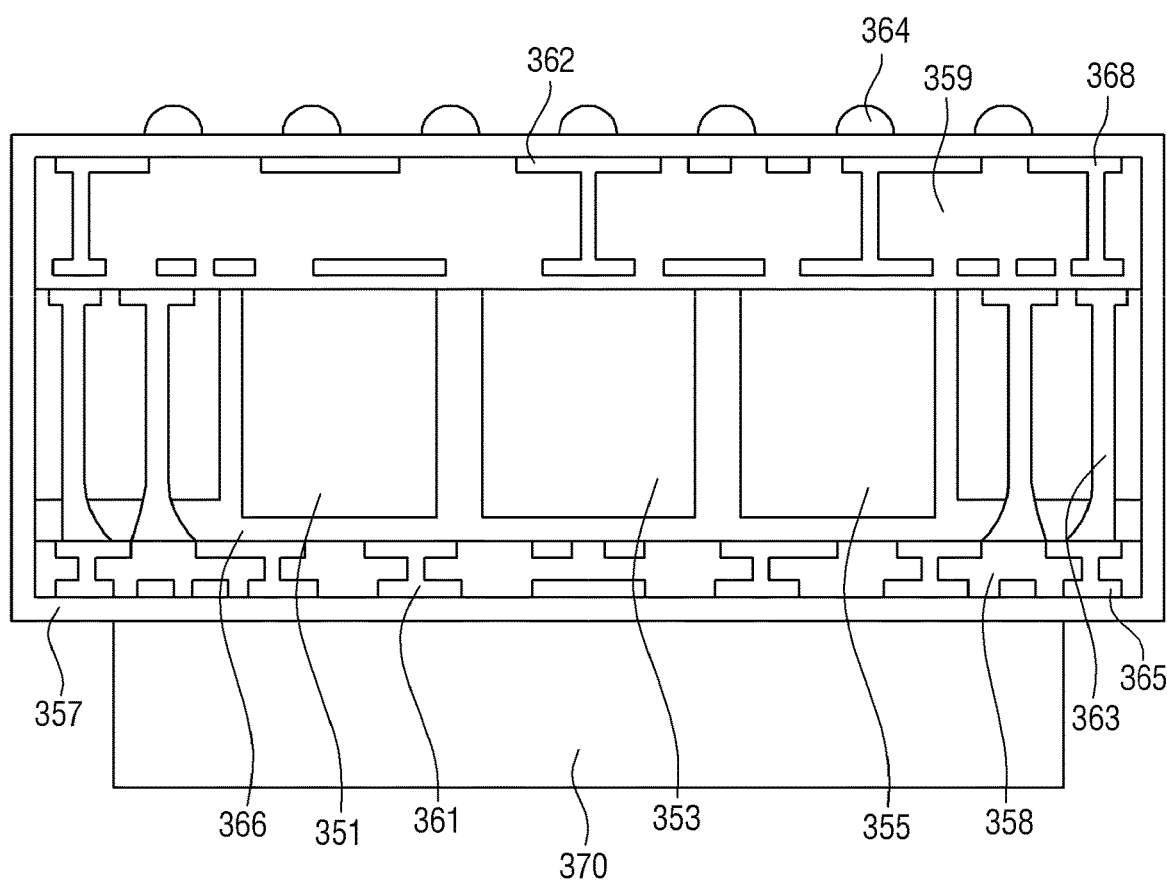
FIG. 10 is a cross-sectional view of the second driving chip module according to an embodiment.
Figure 11:
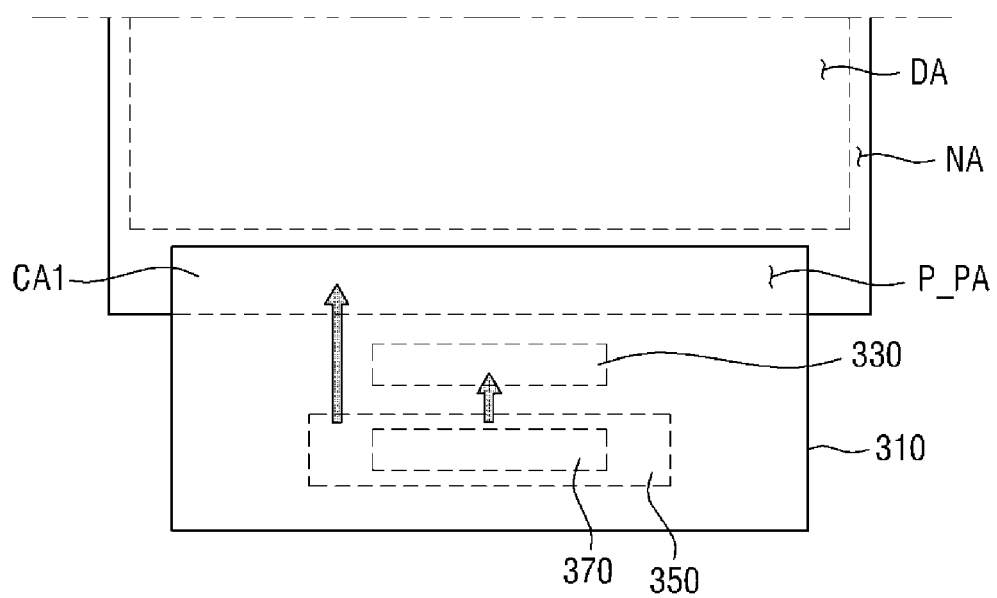
FIG. 11 is a schematic diagram illustrating signal transmission of the display device according to an embodiment.

FIG. 9 is a cross-sectional view taken along line IX-IX' in FIG. 3, FIG. 10 is a cross-sectional view of the second driving chip module according to an embodiment, and FIG. 11 is a schematic diagram illustrating signal transmission of the display device according to an embodiment.

Referring to FIGS. 9 to 11, the circuit board 300 may include the base board 310 or a base film, a conductive layer 320 or a wiring layer disposed on the base board 310, the first driving chip module 330 disposed on the conductive layer 320, the second driving chip module 350 disposed on the conductive layer 320 to be spaced apart from the first driving chip module 330, and the connector 370 disposed on the second driving chip module 350.

Although not shown, the connector 370 may be electrically connected to a main circuit board of the display device 1.

The base film 310 may include a material which is flexible and has an insulation function such as polyimide or the like.

The wiring layer 320 disposed on the base film 310 may include a metal material. The wiring layer 320 may include one or more metals selected from the group including molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The wiring layer 320 may directly disposed on one surface of the base film 310.

The first driving chip module 330 may be electrically connected to the wiring layer 320 of the circuit board 300 through a bump (BUMP). The bump (BUMP) and a second anisotropic conductive film ACF2 may be disposed between the first driving chip module 330 and the wiring layer 320. The bump (BUMP) may be disposed between the first driving chip module 330 and the second anisotropic conductive film ACF2, and the second anisotropic conductive film ACF2 may be disposed between the bump (BUMP) and the wiring layer 320.

The bump (BUMP) may be electrically connected to the wiring layer 320 through the second anisotropic conductive film ACF2 to serve to electrically connect the first driving chip module 330 and the circuit board 300. The second anisotropic conductive film ACF2 and the above-described anisotropic conductive film ACF1 may include the same material.

In FIG. 9, although an example in which one bump (BUMP) is disposed on each of one end and the other end of the first driving chip module 330 in the second direction DR2 is described, the number of bumps (BUMP) is not limited.

The scan control signals SCS and the emission control signals ECS of the timing controller 331 of the first driving chip module 330 may be respectively input to the scan driver 410 and the emission control driver 420 on the display panel 100 through the bumps (BUMP).

The second driving chip module 350 may be disposed on the wiring layer 320 and electrically connected to the wiring layer 320. The second driving chip module 350 may be disposed to overlap the connector 370 in a thickness direction. The second driving chip module 350 may be disposed between the connector 370 and the wiring layer 320. The plurality of driving chips of the second driving chip module 350 and the connector 370 may be electrically connected to the first driving chip module 330 or the display panel 100 through connection parts 364 of the second driving chip module 350.

An insulation layer SR may be further disposed around the first driving chip module 330 and the second driving chip module 350. The insulation layer SR may include organic insulation materials. The insulation layer SR may be disposed between the anisotropic conductive film ACF1 and the first driving chip module 330, and may be disposed between the first driving chip module 330 and the second driving chip module 350 in a plan view. The insulation layer SR may surround the first driving chip module 330 and the second driving chip module 350 in a plan view, and cover side surfaces of the first driving chip module 330 and the second driving chip module 350 to prevent an electrical short circuit of each of the first driving chip module 330 and the second driving chip module 350.

Further, the insulation layer SR is not disposed in an area of the wiring layer 320 which is connected to the display panel 100 (an area in which the anisotropic conductive film ACF1 is disposed), an area in which the first driving chip module 330 is connected to the wiring layer 320 (an area in which the second anisotropic conductive film ACF2 is disposed), and an area in which the second driving chip module 350 is connected to the wiring layer 320 (an area in which the connection parts 364 are disposed), and one surface of the wiring layer 320 may be exposed.

As shown in FIG. 10, the second driving chip module 350 may include a frame 357 and a plurality of components accommodated in the frame 357. The plurality of components of the second driving chip module 350 may include a first insulation layer 358, the above-described plurality of driving chips 351, 353, and 355 disposed on the first insulation layer 358 or a first insulation board, and a second insulation layer 359 or a second insulation board disposed on the plurality of driving chips 351, 353, and 355. Further, a third insulation layer 366 may be disposed between and around the plurality of driving chips 351, 353, and 355. The third insulation layer 366 may be disposed to separate each of the plurality of driving chips 351, 353, and 355 from each other. The third insulation layer 366 and the plurality of driving chips 351, 353, and 355 may be disposed on the same layer.

Each of the first insulation layer 358 and the second insulation layer 359 may include organic insulation materials.

A plurality of first vias 361 and a plurality of third vias 365 may be disposed to pass through the first insulation layer 358. Further, fifth vias 363 may be disposed around the plurality of driving chips 351, 353, and 355 in the third insulation layer 366, and may pass through the third insulation layer 366 in a thickness direction.

The first via 361 may serve to electrically connect the connector 370 and the plurality of driving chips 351, 353, and 355, and the third vias 365 may be electrically connected to the fifth vias 363.

A predetermined separation space may be disposed between the first insulation layer 358 and the plurality of driving chips 351, 353, and 355. That is, the plurality of driving chips 351, 353, and 355 and the first insulation layer 358 may be disposed to be spaced apart from each other with the predetermined separation space therebetween.

The plurality of driving chips 351, 353, and 355 may be disposed between the first insulation layer 358 and the second insulation layer 359. A plurality of second vias 362 and fourth vias 368 may be disposed in the second insulation layer 359. The second vias 362 may be disposed between the plurality of driving chips 351, 353, and 355 and the connection part 364 to serve to electrically connect the plurality of driving chips 351, 353, and 355 and the connection part 364, and the fourth vias 368 may be disposed between the fifth vias 363 and the connection part 364 to electrically connect the fifth vias 363 and the connection part 364.

In FIG. 10, although the frame 357 is shown as not having openings formed between the first and third vias 361, 365 and the connector 370 and between the second and fourth vias 362, 368 and the connection part 364, in the frame 357, first openings may be formed to electrically connect the first vias 361 and the third vias 365 to the connector 370, and second openings may be formed to electrically connect the second via 362 and the fourth via 368 to the connection part 364. Each of the first vias 361 and the third vias 365 may be electrically connected to the connector 370 through the first opening, and each of second vias 362 and the fourth vias 368 may be electrically connected to the connection part 364 through the second opening.

The connection part 364 may be plural in number. The plurality of connection parts 364 may be attached to the wiring layer 320 of the circuit board 300. Although not shown in the drawings, an anisotropic conductive film may be interposed between the wiring layer 320 of the circuit board 300 and the connection part 364, and the wiring layer 320 and the connection part 364 may be electrically connected through the anisotropic conductive film. However, the inventive concepts are not limited to the above, and the wiring layer 320 and the connection part 364 may be directly electrically connected through ultrasonic bonding or the like.

A semicircular shape is exemplified as a shape of the connection part 364, but the inventive concepts are not limited to the above, and a rectangular shape, an elliptical shape, or another polygonal shape may be applied as the shape of the connection part 364.

Referring to FIG. 11, in the display device 1 according to an embodiment, the power supply unit 351, the image data input unit 353, and the driving controller 355, which are described above, may not be attached to the other end of the circuit board 300 opposite one end of the circuit board 300 attached to the display panel 100, and may be directly attached to the circuit board 300. As described above, when the printed circuit board (PCB) is attached to the other end of the circuit board 300, and the power supply unit 351, the image data input unit 353, and the driving controller 355, which are described above, are mounted on the printed circuit board (PCB), signals applied from the connector 370 and the plurality of driving chips 351, 353, and 355 may be transmitted to the display panel 100 through a connection part between the printed circuit board (PCB) and the other end of the circuit board 300, and the connection part (see P_PA in FIG. 1) between the circuit board 300 and the display panel 100. Resistance matching may not be easy while passing the signals applied from the connector 370 and the plurality of driving chips 351, 353, and 355 through two connection parts. That is, a resistance imbalance between lead lines connected to the connector 370 and the plurality of driving chips 351, 353, and 355 of the printed circuit board (PCB) and lead lines connected to the connector 370 and the plurality of driving chips 351, 353, and 355 of the circuit board 300 may occur.

Particularly, as described above, the lead lines connected to the connector 370 and the plurality of driving chips 351, 353, and 355 of the printed circuit board (PCB) and the lead lines connected to the connector 370 and the plurality of driving chips 351, 353, and 355 of the circuit board 300 are connected to each other through the anisotropic conductive film, and even when a process of bonding the lead lines connected to the connector 370 and the plurality of driving chips 351, 353, and 355 of the printed circuit board (PCB) and the lead lines connected to the connector 370 and the plurality of driving chips 351, 353, and 355 of the circuit board 300 is carried out with the same resistance adjusted, the resistances of the lead lines connected to the connector 370 and the plurality of driving chips 351, 353, and 355 of the printed circuit board (PCB) may be changed by passing through the anisotropic conductive film. Accordingly, the above-described resistance imbalance between the lead lines may occur. The resistance imbalance between the lead lines may cause signal transmission failures such as signal transmission delay, signal distortion, or the like.

However, in the display device 1 according to an embodiment, since the power supply unit 351, the image data input unit 353, and the driving controller 355, which are described above, are not mounted on the printed circuit board (PCB) different from the circuit board 300 and directly mounted on the circuit board 300, the lead lines connected to the connector 370 and the plurality of driving chips 351, 353, and 355 of the printed circuit board (PCB) and the lead lines connected to the connector 370 and the plurality of driving chips 351, 353, and 355 of the circuit board 300 do not have to be connected through the anisotropic conductive film, and accordingly, the resistance imbalance may be prevented from occurring. Accordingly, signal transmission failures such as signal transmission delay, signal distortion, or the like in the display device 1 may be prevented.

Further, as shown in FIG. 11, since the connection parts between the printed circuit board (PCB) and the circuit board 300 are omitted, a speed of each of signal transmission between the connector 370 and the display panel 100, and signal transmission between the second driving chip module 350 and the display panel 100 may be increased, and accordingly, a high-speed and high-resolution display device may be implemented.

Hereinafter, a display device according to another embodiment will be described. In the following embodiments, components the same as those in the above-described embodiment will be referred to with the same reference numerals, and descriptions of the components will be omitted or simplified.

Figure 12:
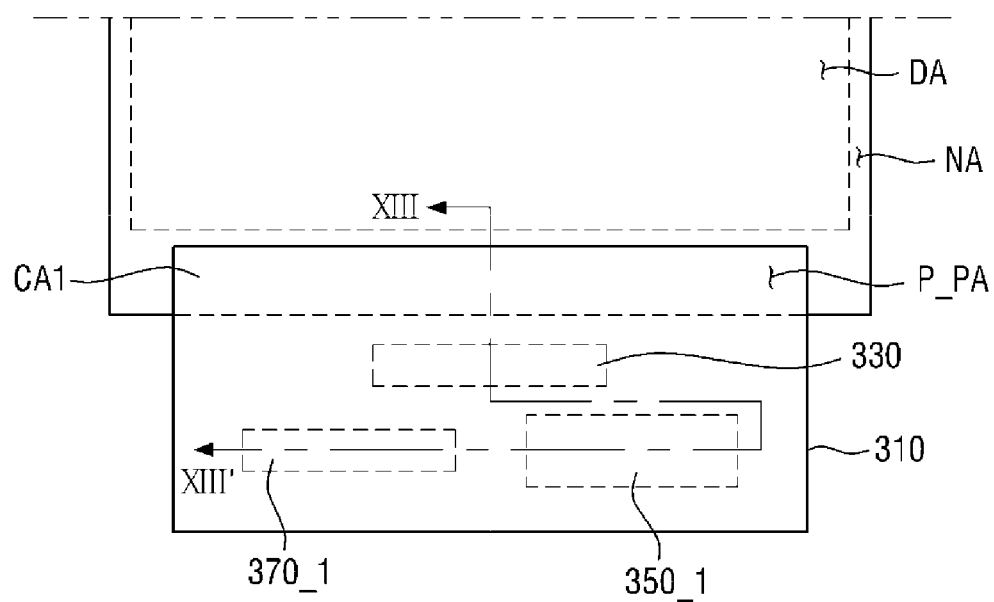
FIG. 12 is a plan view illustrating a display panel according to another embodiment, and a printed circuit film having one end portion to which the display panel is attached.
Figure 13:
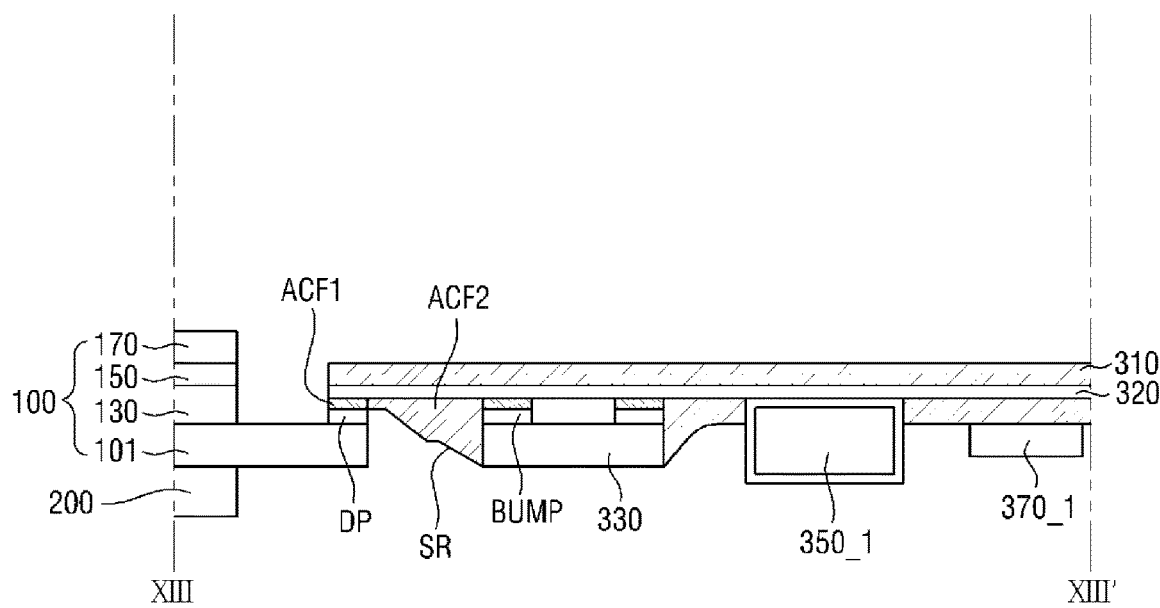
FIG. 13 is a cross-sectional view taken along line XIII-XIII' in FIG. 12.

FIG. 12 is a plan view illustrating a display panel according to another embodiment, and a printed circuit film having one end portion to which the display panel is attached, and FIG. 13 is a cross-sectional view taken along line XIII-XIII' in FIG. 12.

Referring to FIGS. 12, and 13, a display device 2 according to the present embodiment is different from the display device 1 according to the previous embodiment in that a connector 370_1 and a second driving chip module 350_1 do not overlap in a thickness direction.

More specifically, in the display device 2 according to the present embodiment, the connector 370_1 and the second driving chip module 350_1 may not overlap in the thickness direction.

As shown in FIG. 13, connection parts of the connector 370_1 connected to the second driving chip module 350_1 may be electrically connected to the wiring layer 320. The connection parts of the connector 370_1 may be electrically connected to the first vias and the third vias described in FIG. 10.

In some embodiments, at least one of connection parts of the connector 370_1 may not be electrically connected to the first vias and the third vias and may be directly electrically connected to a first driving chip module 330 or a display panel 100.

In the present embodiment, since the power supply unit 351, the image data input unit 353, and the driving controller 355, which are described above, are not mounted on the printed circuit board (PCB) different from the circuit board 300 and directly mounted on the circuit board 300, the lead lines connected to the connector 370 and the plurality of driving chips 351, 353, and 355 of the printed circuit board (PCB) and the lead lines connected to the connector 370_1 and the plurality of driving chips 351, 353, and 355 of the circuit board 300 do not have to be connected through an anisotropic conductive film, and accordingly, the resistance imbalance may be prevented from occurring. Accordingly, signal transmission failures, such as signal transmission delay, signal distortion, or the like in the display device 2 may be prevented.

Further, since connection parts between the printed circuit board (PCB) and the circuit board 300 are omitted, a speed of each of signal transmission between the connector 370 and the display panel 100, and signal transmission between the second driving chip module 350 and the display panel 100 may be increased, and accordingly, a high-speed and high-resolution display device may be implemented.

Figure 14:
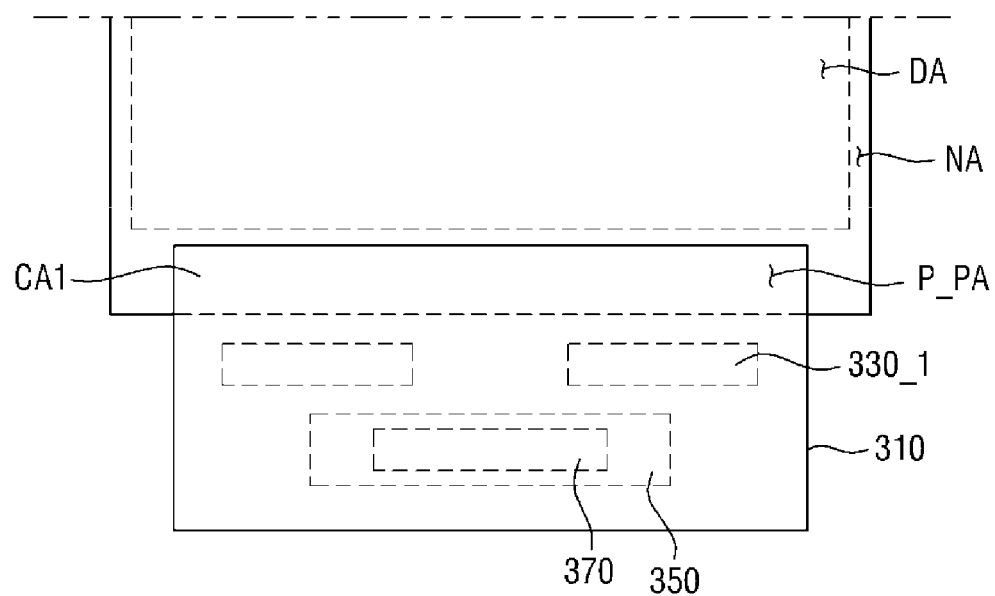
FIG. 14 is a plan view illustrating a display panel according to still another embodiment, and a printed circuit film having one end portion to which the display panel is attached.

FIG. 14 is a plan view illustrating a display panel according to still another embodiment, and a printed circuit film having one end portion to which the display panel is attached.

A display device 3 according to the present embodiment is different from the display device 1 according the first embodiment in that a plurality of first driving chip modules 330_1 are configured.

More specifically, in the display device 3 according to the present embodiment, a plurality of first driving chip modules 330_1 may be configured. The display device 3 according to the present embodiment may be, for example a large display device such as a tablet PC, a television, a notebook, a monitor, or the like, but is not limited thereto.

In FIG. 14, although an example in which the number of first driving chip modules 330_1 is two is described, the present disclosure is not limited to the above, and the number of first driving chip modules 330_1 may be three or more.

Since the plurality of first driving chip modules 330_1 are applied, the display device 3 according to the present embodiment may be implemented as a higher-resolution display device.

Further, since the power supply unit 351, the image data input unit 353, and the driving controller 355, which are described above, are not mounted on the printed circuit board (PCB) different from the circuit board 300 and directly mounted on the circuit board 300, the lead lines connected to the connector 370 and the plurality of driving chips 351, 353, and 355 of the printed circuit board (PCB) and the lead lines connected to the connector 370_1 and the plurality of driving chips 351, 353, and 355 of the circuit board 300 do not have to be connected through an anisotropic conductive film, and accordingly, the resistance imbalance may be prevented from occurring. Accordingly, signal transmission failures such as signal transmission delay, signal distortion, or the like in the display device 3 may be prevented.

Further, since connection parts between the printed circuit board (PCB) and the circuit board 300 are omitted, a speed of each of signal transmission between the connector 370 and the display panel 100, and signal transmission between the second driving chip module 350 and the display panel 100 may be increased, and accordingly, a high-speed and high-resolution display device may be implemented.

Figure 15:
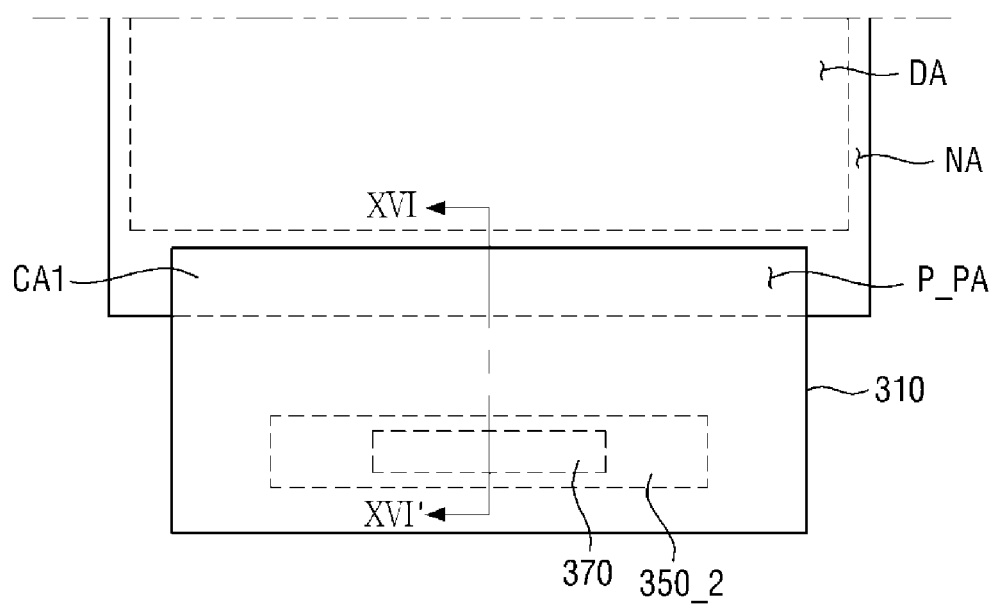
FIG. 15 is a plan view illustrating a display panel according to yet another embodiment, and a printed circuit film having one end portion to which the display panel is attached.
Figure 16:
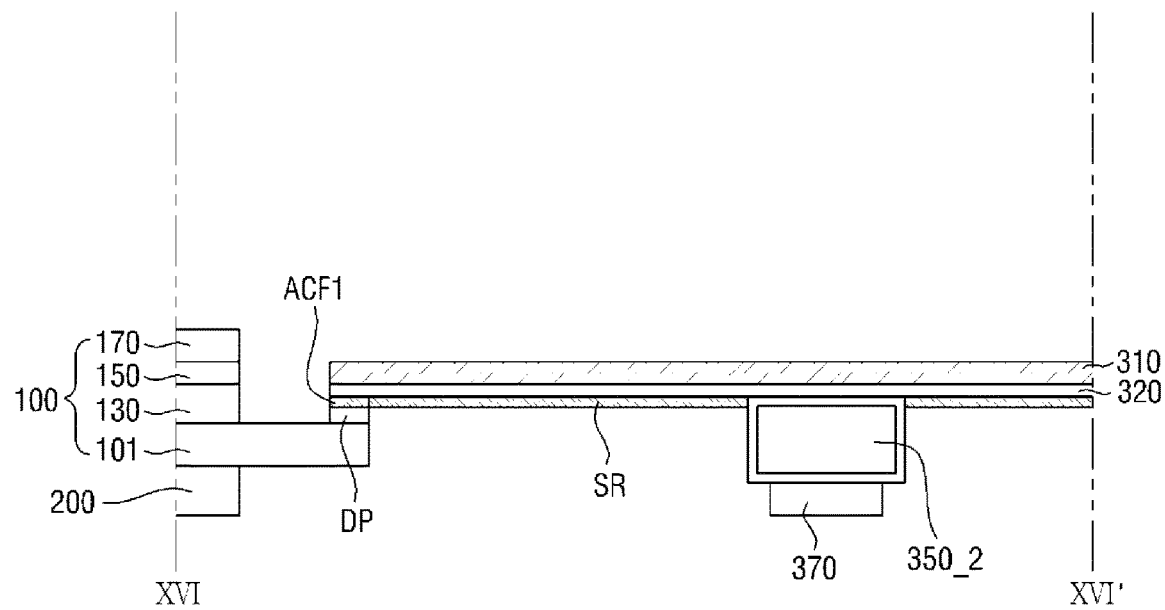
FIG. 16 is a cross-sectional view taken along line XVI-XVI' in FIG. 15.

FIG. 15 is a plan view illustrating a display panel according to yet another embodiment, and a printed circuit film having one end portion to which the display panel is attached, and FIG. 16 is a cross-sectional view taken along line XVI-XVI' in FIG. 15.

Referring to FIGS. 15 and 16, a display device 4 according to the present embodiment is different from the display device 1 according to the embodiment shown in FIG. 3 in that the first driving chip module 330 according to FIG. 3 is included in a second driving chip module 350_2.

More specifically, in the display device 4 according to the present embodiment, the second driving chip module 350_2 may include the first driving chip module 330 described in FIG. 3.

As described above, overlapping descriptions of other descriptions will be omitted.

Figure 17:
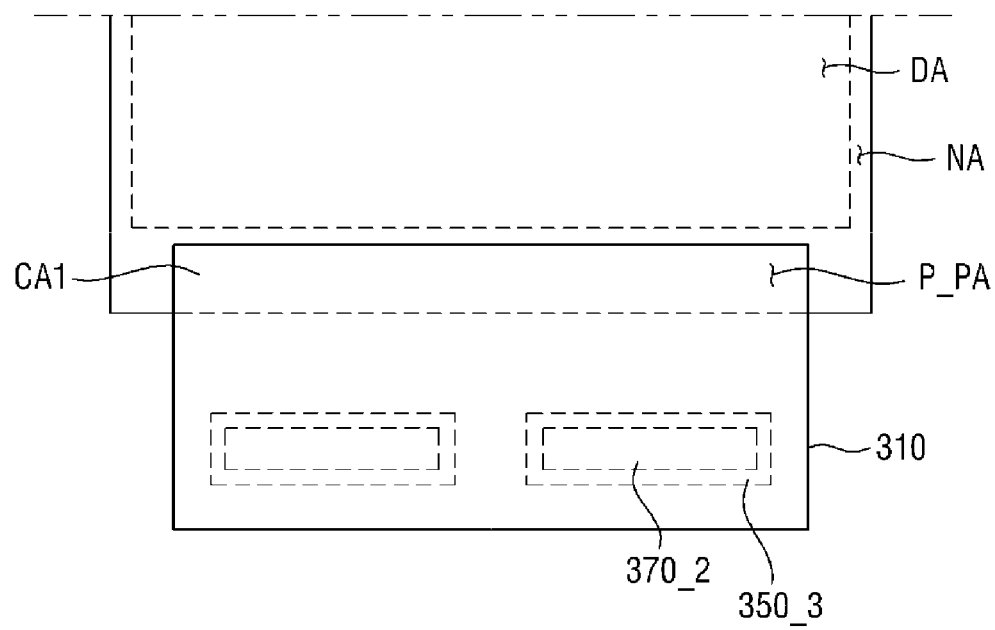
FIG. 17 is a plan view illustrating a display panel according to yet another embodiment, and a printed circuit film having one end portion to which the display panel is attached.

FIG. 17 is a plan view illustrating a display panel according to yet another embodiment, and a printed circuit film having one end portion to which the display panel is attached.

Referring to FIG. 17, a display device 5 according to the present embodiment is different from that in FIGS. 15 and 16 in that the second driving chip module 350_2 described in FIGS. 15 and 16 is applied as a plurality of second driving chip modules 350_3.

More specifically, in the display device 5 according to the present embodiment, a plurality of second driving chip modules 350_3 may be configured. An example in which the number of second driving chip modules 350_3 is two is described in FIG. 17, the inventive concepts are not limited to the above, and the number of second driving chip modules 350_3 may be three or more.

According to embodiments of the present disclosure, a display device capable of simplifying a module structure to reduce the number of components used, and simplifying a process to secure a process time can be configured.

Further, a display device capable of ultra-high resolution processing at an ultra-high speed can be configured.

Effects according to the inventive concepts are not limited to the above, and more various effects are included in the specification.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel; and
a printed circuit board attached to one end portion of the display panel,
wherein:
the printed circuit board includes a base board, a first driving chip module disposed on the base board, and a second driving chip module disposed to be spaced apart from the first driving chip module;

the first driving chip module includes a timing controller and a data driver;

the second driving chip module includes a plurality of driving chips embedded together;

the printed circuit board further includes a conductive layer disposed between the base board and the first driving chip module and bumps disposed between the conductive layer and the first driving chip module; and the first driving chip module is electrically connected to the conductive layer through the bumps.

2. The display device of claim 1, wherein a first one of the plurality of driving chips includes an image data input unit and a second one of the plurality of driving chips includes a power supply unit.

3. The display device of claim 2, wherein a third one of the plurality of driving chips includes a driving controller.

4. The display device of claim 2, wherein:

the image data input unit is configured to transmit a data signal to the timing controller; and the power supply unit is configured to transmit a power signal to the display panel.

5. The display device of claim 4, wherein the timing controller is configured to transmit the data signal and a data control signal to the data driver.

6. The display device of claim 1, wherein the second driving chip module is electrically connected to the conductive layer.

7. The display device of claim 6, further comprising an insulation layer disposed on the conductive layer and exposed in an area in which the first driving chip module and the second driving chip module are disposed.

8. The display device of claim 7, wherein the insulation layer contacts a side surface of each of the first driving chip module and the second driving chip module.

9. The display device of claim 6, further comprising a connector disposed on the base board, wherein the connector is electrically connected to a main circuit board.

10. The display device of claim 9, wherein the connector overlaps the second driving chip module in a thickness direction.

11. The display device of claim 10, wherein the second driving chip module further includes a first insulation layer disposed between the driving chips and the connector, and a first via configured to pass through the first insulation layer and electrically connect the driving chips and the connector.

12. The display device of claim 11, wherein the second driving chip module further includes a second insulation layer disposed between the driving chips and the conductive layer, and a second via configured to electrically connect the driving chips and the conductive layer.

13. The display device of claim 12, wherein:

the second driving chip module further includes a third via which passes through the first insulation layer and is different from the first via, and a fourth via which passes through the second insulation layer and is different from the second via; and the connector is electrically connected to the conductive layer through the third via and the fourth via.

14. The display device of claim 13, further comprising a third insulation layer disposed between the first insulation layer and the second insulation layer, wherein the third insulation layer is disposed on the same layer as the plurality of driving chips, and the third via and the fourth via are electrically connected to each other through a fifth via of the third insulation layer.

15. The display device of claim 14, wherein the second driving chip module further includes a frame in which the insulation layers, the vias, and the plurality of driving chips are mounted.

16. The display device of claim 15, wherein:

the second driving chip module further includes a connection part disposed on a surface opposite one surface of the frame facing the second insulation layer;

the connection part is electrically connected to the second via and the fourth via; and the connection part is electrically connected to the conductive layer.

17. The display device of claim 14, wherein the first insulation layer and the plurality of driving chips are disposed to be spaced apart from each other with a separation space therebetween.

18. The display device of claim 9, wherein the connector is disposed so as not to overlap the second driving chip module in a thickness direction.

19. A display device comprising:

a display panel; and a printed circuit board attached to one end portion of the display panel, wherein:

the printed circuit board includes a base board, a first driving chip module disposed on the base board, and a second driving chip module disposed to be spaced apart from the first driving chip module;

the first driving chip module includes a data driver;

the second driving chip module includes a plurality of driving chips embedded together;

a first one of the plurality of driving chips includes an image data input unit, a second one of the plurality of driving chips includes a power supply unit, and a third one of the plurality of driving chips includes a timing controller;

the printed circuit board further includes a conductive layer disposed between the base board and the first driving chip module and bumps disposed between the conductive layer and the first driving chip module; and the first driving chip module is electrically connected to the conductive layer through the bumps.

* * * * *